(12) United States Patent
Sayama et al.

(10) Patent No.: US 6,670,277 B2
(45) Date of Patent: Dec. 30, 2003

(54) METHOD OF MANUFACTURING SEMICONDUCTOR DEVICE

(75) Inventors: Hirokazu Sayama, Tokyo (JP); Yoshinori Okumura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/984,144

(22) Filed: Oct. 29, 2001

(65) Prior Publication Data

US 2002/0160613 A1 Oct. 31, 2002

(30) Foreign Application Priority Data

Apr. 26, 2001 (JP) ........................................ 2001-129523

(51) Int. Cl.[7] ............................................. H01L 21/302
(52) U.S. Cl. ..................... 438/706; 438/710; 438/720; 438/745; 438/750; 438/283; 438/299; 438/300; 216/67
(58) Field of Search ................................. 438/706, 710, 438/720, 745, 750, 283, 299, 300; 216/67

(56) References Cited

U.S. PATENT DOCUMENTS 5,891,784 A * 4/1999 Cheung et al. ............. 438/303
6,287,922 B1 * 9/2001 Yu et al. ..................... 438/299
6,291,355 B1 * 9/2001 Liu et al. .................... 438/706

FOREIGN PATENT DOCUMENTS

JP 62-114271 5/1987
JP 64-47073 2/1989

* cited by examiner

*Primary Examiner*—Nadine G. Norton
*Assistant Examiner*—Lan Vinh
(74) *Attorney, Agent, or Firm*—Oblon, Spivak, McClelland, Maier & Neustadt, P.C.

(57) ABSTRACT

A semiconductor device manufacturing method for manufacturing a semiconductor device of constant finished dimensions as designed even when a material which is difficult to increase etch selectivity to a silicon film in a gate electrode or wiring structure is used for an anti-reflection coating, and which is also capable of achieving finer patterning through the use of a silicon oxide film or the like as a hard mask. For example, a silicon oxy-nitride film and a silicon oxide film are used for an anti-reflection coating and a hard mask, respectively, to provide etch selectivity therebetween. In etching of the anti-reflection coating and the hard mask, the hard mask such as a silicon oxide film is not completely etched in order to leave a non-single crystalline silicon film covered, under which condition the anti-reflection coating is removed.

17 Claims, 10 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device including a wiring structure or a gate electrode structure of a MOSFET (metal oxide semiconductor field effect transistor) formed on a semiconductor substrate.

2. Description of the Background Art

A conventional method of manufacturing a MOSFET, for example, will be set forth with reference to FIGS. 12 to 17. First, a gate insulating film 40 and a non-single crystalline silicon film 50 are formed on a semiconductor substrate 10 such as a silicon substrate, in the surface of which a well 30 and an element isolation film 20 are formed (FIG. 12).

Then, a photoresist is formed on the non-single crystalline silicon film 50 and is patterned by a photolithographic technique for formation of a gate electrode. The non-single crystalline silicon film 50 is etched using the photoresist as a mask and a gate electrode is formed by the removal of the photoresist (FIG. 13).

Subsequent ion implantation 100 (FIG. 14) produces source/drain extension layers 60 in the well 30. If the ionic species to be implanted has to be changed depending on the type, p-type or n-type, of the well 30, one side of the well 30 should be covered as necessary with the photoresist.

Then, an insulating film to cover the gate insulating film 40 and the non-single crystalline silicon film 50 is formed and etched to form gate sidewall protection films 70 (FIG. 15). At this time, as shown in FIG. 15, portions of the gate insulating film 40, which are not covered with the non-single crystalline silicon film 50 and the gate sidewall protection films 70, can also be removed.

Following ion implantation 110 (FIG. 16) produces source/drain regions 80 in the well 30. Here again, if the ionic species to be implanted has to be changed depending on the type, p-type or n-type, of the well 30, one side of the well 30 should be covered as necessary with the photoresist. Further, thermal processing may be performed for recovering damage from the ion implantation.

Then, a metal film (Co, etc.) to cover the gate electrode and the substrate is formed by sputtering, and through thermal processing, silicide layers 90 of $CoSi_2$, etc., are formed in the surface of the gate electrode of the non-single crystalline silicon film 50 and in the surface of the source/drain regions 80 (FIG. 17). At this time, the unreacted metal film is removed and residual compounds are changed into the silicide layers 90 through appropriate thermal processing.

In the aforementioned MOSFET manufacturing method, the patterning of the non-single crystalline silicon film 50 during the transition from the step of FIG. 12 to that of FIG. 13 may be done with the photoresist, or alternatively, it may be done with a material of higher physical strength than the photoresist, such as a silicon oxide film, as an etching mask (such an etching mask is hereinafter referred to as a "hard mask").

In such a case, a hard mask 55 is formed after the step of FIG. 12 (FIG. 18) and a photoresist is formed on the hard mask 55 and is patterned by the photolithographic technique for formation of a gate electrode.

The hard mask 55 is then etched using the photoresist as a mask and the photoresist is removed (FIG. 19). During the etching of the hard mask 55, the non-single crystalline silicon film 50 also is somewhat etched, causing a difference in level 50a as shown in FIG. 19. This, however, can be prevented by setting a high etch selectivity between the non-single crystalline silicon film 50 and the hard mask 55.

The non-single crystalline silicon film 50 is etched using the hard mask 55 as a mask, whereby a gate electrode is formed (FIG. 20).

The use of the hard mask 55 as a mask brings the following advantages. If a material with great controllability over etching, such as a silicon oxide film, is used as a hard mask, finer patterning can be achieved with additional isotropic etching after the step of FIG. 19 (FIG. 21). If this hard mask is used as a mask for the patterning of the non-single crystalline silicon film 50, a gate electrode of smaller dimensions can be formed (FIG. 22).

Taking, for example, a KrF excimer laser which is commonly used as a light source in the current photolithographic technique. Since the laser has a wavelength of 0.248 $\mu$m, exposure only is not enough to achieve a gate length on the order of 0.1 $\mu$m. However, the use of the aforementioned material with great controllability over etching as a hard mask allows patterning for formation of a gate electrode of smaller dimensions as shown in FIG. 21.

While the above description refers to the method of manufacturing a gate electrode of a MOSFET, the same process as shown in FIGS. 12 and 13 is also applicable to the formation of a wiring structure on the substrate.

Now, it is effective for MOSFETs to reduce their gate lengths for higher performance and higher integration density. Also in the formation of a wiring structure, a reduced width of wiring is required for higher integration density.

In forming elements in a wafer, however, it is difficult to provide uniform exposure in the photolithographic process since the crowdedness of the pattern is generally different in each location. More specifically, such a difference in the pattern crowdedness varies the reflection of a light beam during exposure and thereby makes it difficult to transfer the pattern as designed on the photoresist. It is thus not easy to uniformly reduce the gate lengths in the wafer surface.

To reduce variations occurring during process due to variations in the pattern crowdedness, anti-reflection coatings (ARC) have been introduced. The anti-reflection coatings are films for preventing a transmitted light which passes through a resist during exposure in the photolithographic process from reflecting and adversely effecting design dimensions such as the gate length. Specifically, a silicon oxy-nitride film, for example, serves as a material for the anti-reflection coatings.

The anti-reflection coatings come in two types: those for filling irregularities of the pattern crowdedness and those for preventing the occurrence of multiple reflections which is a phenomenon that repeated reflections of the transmitted light occur between the substrate and the resist. Herein, the latter anti-reflection coatings shall be noted.

When the anti-reflection coating is introduced into the aforementioned semiconductor device manufacturing method using a hard mask, the following problems arise. A silicon oxy-nitride film, for example, is a material which is difficult to increase etch selectivity to silicon. Using such a silicon oxy-nitride film for the anti-reflection coating makes it difficult to etch only the anti-reflection coating without etching the substrate and the gate electrode in a process where the silicon substrate and the polysilicon gate electrode are exposed.

This will be described with reference to FIGS. 23 to 29. After the step of FIG. 18, an anti-reflection coating 56 is formed over the whole surface of the hard mask 55 (FIG. 23). At this time, the anti-reflection coating 56 is not directly formed on the non-single crystalline silicon film 50 in order to prevent the non-single crystalline silicon film 50 from being etched upon completion of the etching of the anti-reflection film 56 and thereby to prevent the occurrence of variations in the height of the gate electrode, when a material which is difficult to increase etch selectivity to silicon, such as a silicon oxy-nitride film, is used for the anti-reflection coating 56.

Following this, a photoresist is formed on the anti-reflection coating 56 and is patterned by the photolithographic technique for formation of a gate electrode. The anti-reflection coating 56 and the hard mask 55 are then etched using the photoresist as a mask and the photoresist is removed (FIG. 24).

During the etching of the hard mask 55, the non-single crystalline silicon film 50 also is somewhat etched as shown in FIG. 24. This, however, can be prevented by setting a high etch selectivity between the hard mask 55 and both the non-single crystalline silicon film 50 and the anti-reflection coating 56.

Then, only the anti-reflection coating 56 is removed by etching and the non-single crystalline silicon film 50 is etched using the hard mask 55 as a mask, whereby a gate electrode is formed.

When a material which is difficult to increase etch selectivity to silicon, such as a silicon oxy-nitride film, is used for the anti-reflection coating 56, it becomes difficult to insure etch selectivity to the non-single crystalline silicon film 50. Thus, if the anti-reflection coating 56 is removed with an etching solution of phosphoric acid, for example, the non-single crystalline silicon film 50 is further etched as shown in FIG. 25.

This produces constrictions 50c in the gate electrode and prevents the manufacture of a semiconductor device of designed dimensions through the use of the hard mask 55 as a mask. Also, a problem of varying finished dimensions arises.

These problems can be solved by adopting not isotropic etching such as wet etching but adopting anisotropic etching such as RIE (reactive ion etching) to the process of removing the anti-reflection coating 56.

There is however still another problem which cannot be solved by only the adoption of anisotropic etching. That is, anisotropic etching is difficult to coexist with the process of isotropic etching of the hard mask 55 for finer patterning.

FIG. 26 shows the state after the completion of anisotropic etching and the removal of the anti-reflection coating 56 in the step of FIG. 24. Although no such constrictions as illustrated in FIG. 25 are seen in FIG. 26, the surface of the non-single crystalline silicon film 50 is removed simultaneously with the removal of the anti-reflection coating 56. The non-single crystalline silicon film 50, therefore, has a great difference in level 50d between a portion directly under the hard mask 55 and a portion not covered with the hard mask 55. This difference in level 50d is greater than the difference in level 50a shown in FIG. 19.

Under this condition, the hard mask 55 is isotropically etched for allowing finer patterning of non-single crystalline silicon, which is shown in FIG. 27. If, in FIG. 27, only the thickness of a portion of the non-single crystalline silicon film 50, which had not been covered with the hard mask 55 before the isotropic etching, is etched using the hard mask 55 as a mask, the result is as shown in FIG. 28. That is, the difference in level 50d caused by the removal of the anti-reflection coating 56 remains as-is as a difference in level 50e in the gate electrode; therefore, the finished gate length is not the one as designed.

If the etch time is further extended to eliminate the difference in level 50e in the gate electrode, not only the gate insulating film 40 but also the surface of the semiconductor substrate 10 are etched as shown in FIG. 29, causing depressions 30a. Since recent gate insulating films are designed to be thin, e.g., approximately 1 nm, even if the etch selectivity between the non-signal crystalline silicon film 50 and the gate insulating film 40 is high, the gate insulating film 40 is likely to be etched. Consequently, the semiconductor substrate 10 also is subjected to etching, which may cause the depressions 30a.

The depressions 30a in the semiconductor substrate 10 have an adverse impact on the formation of source/drain regions and on the formation of a silicide layer, resulting in unstable transistor characteristics. The thinner the gate insulating film 40 and the non-single crystalline silicon film 50, the more adverse the impact.

SUMMARY OF THE INVENTION

A first aspect of the present invention is directed to a method of manufacturing a semiconductor device comprising the steps of: (a) preparing a substrate; (b) forming a film to be etched, an etching mask, and a functional film having a predetermined function in this order on the substrate; (c) patterning the functional film and the etching mask by photolithographic and etching techniques, wherein etching of the etching mask is stopped halfway through the patterning; (d) removing the functional film by etching; (e) completing the etching of the etching mask which has been stopped in the step (c); and (f) patterning the film to be etched using the etching mask as a mask.

According to a second aspect of the present invention, in the method of manufacturing a semiconductor device of the first aspect, in the step (e), isotropic etching is performed to reduce a patterning width of the etching mask.

According to a third aspect of the present invention, in the method of manufacturing a semiconductor device of the first aspect, the functional film has etch selectivity to the etching mask, and the step (d) is performed prior to the step (e).

According to a fourth aspect of the present invention, in the method of manufacturing a semiconductor device of the first aspect, the etching of the functional film in the step (d) is completed at the same time as or earlier than completion of the etching of the etching mask in the step (e).

According to a fifth aspect of the present invention, in the method of manufacturing a semiconductor device of the first aspect, the functional film is an anti-reflection coating.

A sixth aspect of the present invention is directed to a method of manufacturing a semiconductor device, comprising the steps of: (a) preparing a substrate; (b) forming a film to be etched, a first etching mask, and a functional film having a predetermined function in this order on the substrate; (c) patterning the functional film and the first etching mask by photolithographic and etching techniques; (d) forming a second etching mask in a portion of the film to be etched which is not covered with both the functional film and the first etching mask; (e) removing the functional film by etching; and (i) removing the second etching mask by etching; (g) patterning the film to be etched using the first etching mask as a mask.

According to a seventh aspect of the present invention, in the method of manufacturing a semiconductor device of the sixth aspect, in the step (f), the removal of the second etching mask is made by isotropic etching which reduces a patterning width of the first etching mask.

According to an eighth aspect of the present invention, in the method of manufacturing a semiconductor device of the sixth aspect, the film to be etched is a non-single crystalline silicon film, the second etching mask is a silicon oxide film, and in the step (d), the second etching mask is formed by oxidizing a surface of the non-single crystalline silicon film.

According to a ninth aspect of the present invention, in the method of manufacturing a semiconductor device of the sixth aspect, the functional film has etch selectivity to the second etching mask, and the step (e) is performed prior to the step (f).

According to a tenth aspect of the present invention, in the method of manufacturing a semiconductor device of the sixth aspect, the removal of the functional film in the step (e) is completed at the same time as or earlier than the removal of the second etching mask in the step (f).

According to an eleventh aspect of the present invention, in the method of manufacturing a semiconductor device of the sixth aspect, the functional film is an anti-reflection coating.

In the first aspect of the present invention, in the step (c), the etching of the etching mask is stopped halfway through the patterning, and in the step (d), the function film is removed. Thus, even when a material which is difficult to increase etch selectivity to the film to be etched is used for the function film, a depression or a difference in level is unlikely to occur in the film to be etched, which allows the manufacture of a semiconductor device of constant finished dimensions as designed.

In the second aspect of the present invention, in the step (e), after the completion of the removal of the function film, the etching of the etching mask is completed and the patterning width of the etching mask is reduced. The film to be etched can thus be patterned without causing a difference in level. From this, finer patterning of the film to be etched becomes possible.

In the third aspect of the present invention, the function film has etch selectivity to the etching mask and the step (d) is performed prior to the step (e). This prevents the film to be etched from being exposed during the removal of the functional film. Thus, even when a material which is difficult to increase etch selectivity to the film to be etched is used for the functional film, a depression or a difference in level is unlikely to occur in the film to be etched, which allows the manufacture of a semiconductor device of constant finished dimensions as designed.

In the fourth aspect of the present invention, the etching of the functional film in the step (d) is completed at the same time as or earlier than the completion of the etching of the etching mask in the step (e). This prevents the film to be etched from being exposed during the removal of the functional film. Thus, even when a material which is difficult to increase etch selectivity to the film to be etched is used for the functional film, a depression or a difference in level is unlikely to occur in the film to be etched, which allows the manufacture of a semiconductor device of constant finished dimensions as designed.

In the fifth aspect of the present invention, even when a material which is difficult to increase etch selectivity to the film to be etched is used for the anti-reflection coating, a depression or a difference in level is unlikely to occur in the film to be etched, which allows the manufacture of a semiconductor device of constant finished dimensions as designed.

In the sixth aspect of the present invention, in the step (d), the second etching mask is formed in a portion of the film to be etched which is not covered with both the function film and the first etching mask, and in the step (e), the function film is removed. Thus, even when a material which is difficult to increase etch selectivity to the film to be etched is used for the functional film, a depression or a difference in level is unlikely to occur in the film to be etched, which allows the manufacture of a semiconductor device of constant finished dimensions as designed.

In the seventh aspect of the present invention, in the step (f), the removal of the second etching mask is made by isotropic etching which reduces the patterning width of the first etching mask. The film to be etched can thus be patterned without causing a difference in level. From this, finer patterning of the film to be etched becomes possible.

In the eighth aspect of the present invention, in the step (d), the second etching mask is formed by oxidizing the surface of the non-single crystalline silicon film. This facilitates the formation of the second etching mask and improves controllability over film thickness.

In the ninth aspect of the present invention, the functional film has etch selectivity to the second etching mask and the step (e) is performed prior to the step (f). This prevents the film to be etched from being exposed during the removal of the functional film. Thus, even when a material which is difficult to increase etch selectivity to the film to be etched is used for the functional film, a depression or a difference in level is unlikely to occur in the film to be etched, which allows the manufacture of a semiconductor device of constant finished dimensions as designed.

In the tenth aspect of the present invention, the removal of the functional film in the step (e) is completed at the same time as or earlier than the removal of the second etching mask in the step (f). This prevents the film to be etched from being exposed during the removal of the functional film. Thus, even when a material which is difficult to increase etch selectivity to the film to be etched is used for the functional film, a depression or a difference in level is unlikely to occur in the film to be etched, which allows the manufacture of a semiconductor device of constant finished dimensions as designed.

In the eleventh aspect of the present invention, even when a material which is difficult to increase etch selectivity to the film to be etched is used for the anti-reflection coating, a depression or a difference in level is unlikely to occur in the film to be etched, which allows the manufacture of a semiconductor device of constant finished dimensions as designed.

An object of the present invention is to provide a semiconductor device manufacturing method that is capable of manufacturing a semiconductor device of constant finished dimensions as designed even when a material which is difficult to increase etch selectivity to a silicon film in a gate electrode or wiring structure is used for an anti-reflection coating, and that is capable of achieving finer patterning through the use of a silicon oxide film or the like as a hard mask.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

In this preferred embodiment, a hard mask is not completely etched in order to leave a non-single crystalline silicon film covered, under which condition an anti-reflection coating is removed. This achieves a semiconductor device manufacturing method that is capable of manufacturing a semiconductor device of constant finished dimensions as designed even when a material which is difficult to increase etch selectivity to the non-single crystalline silicon film is used for the anti-reflection film.

Figure 1:
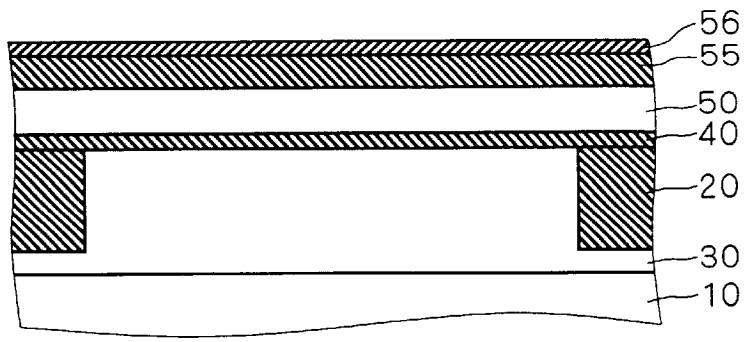
FIGS. 1 to 5 illustrate a method of manufacturing a semiconductor device according to a first preferred embodiment.
Figure 23:
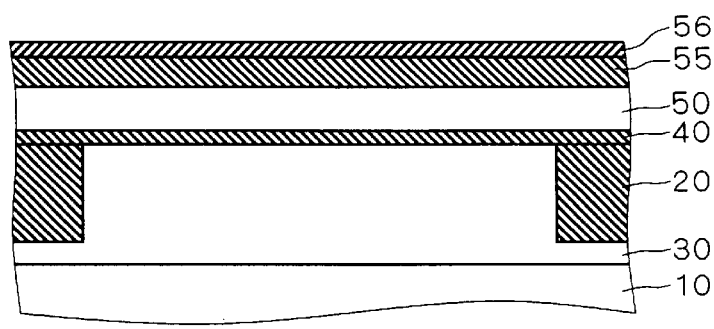
FIGS. 23 to 29 are diagrams for explaining problems in adopting an anti-reflection coating to a conventional semiconductor device manufacturing method using a hard mask.
Figure 24:
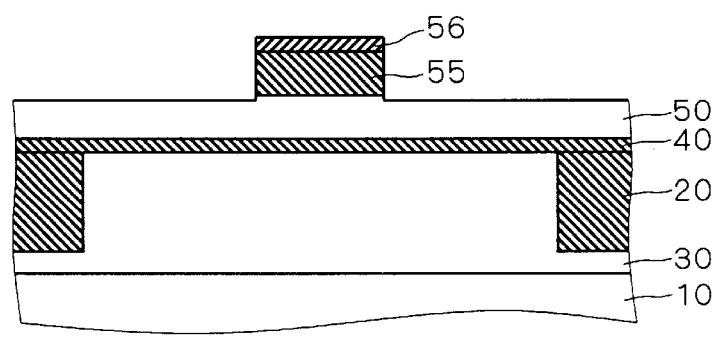
Figure 25:
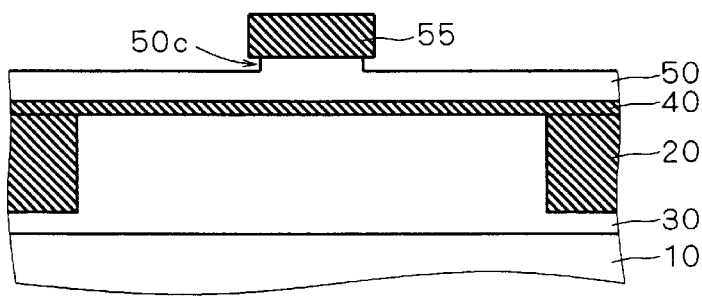

This preferred embodiment will also be described using, for example, a method of manufacturing a MOSFET. First, as shown in FIG. 23, the gate insulating film 40, the non-single crystalline silicon film 50, the hard mask 55, and the anti-reflection coating 56 are formed in this order on the semiconductor substrate 10, such as a silicon substrate, in the surface of which the well 30 and the element isolation film 20 are formed (FIG. 1). The non-single crystalline silicon film 50 here is a film to be etched by the hard mask 55.

For example, a silicon oxide film is used for the gate insulating film 40, polysilicon or amorphous silicon for the non-single crystalline silicon film 50, a silicon oxide film for the hard mask 55, and a silicon oxy-nitride film for the anti-reflection film 56. The anti-reflection coating 56 is of a material having etch selectivity to the hard mask 55 (if a silicon oxide film and a silicon oxy-nitride film are used for the hard mask 55 and the anti-reflection coating 56, respectively, etch selectivity is provided therebetween).

The gate insulating film 40, the non-single crystalline silicon film 50, the hard mask 55, and the anti-reflection coating 56 are 0.5–10 nm thick, 30–50 nm thick, 100–150 nm thick, and 10–100 nm thick, respectively.

Then, a photoresist is formed on the anti-reflection coating 56 and is patterned by the photolithographic technique for formation of a gate electrode. At this time, the presence of the anti-reflection coating 56 allows precise transfer of a gate electrode pattern on the photoresist. The hard mask 55 and the anti-reflection coating 56 are then etched using the photoresist as a mask.

Here, the hard mask 55 is not completely etched in order to leave the non-single crystalline silicon film 50 covered. That is, the etching of the hard mask 55 is stopped halfway through the patterning. This can be achieved by setting a short etch time.

Figure 2:
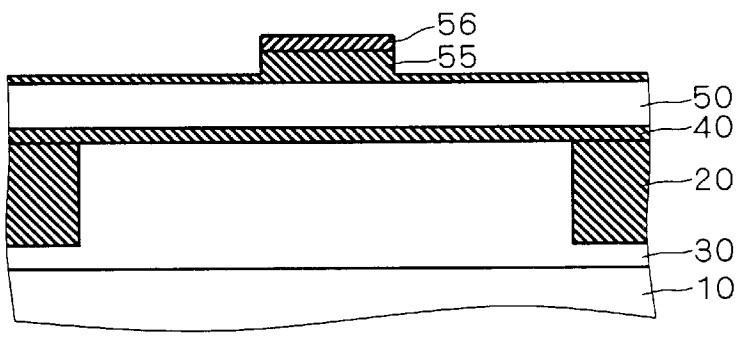
Figure 3:
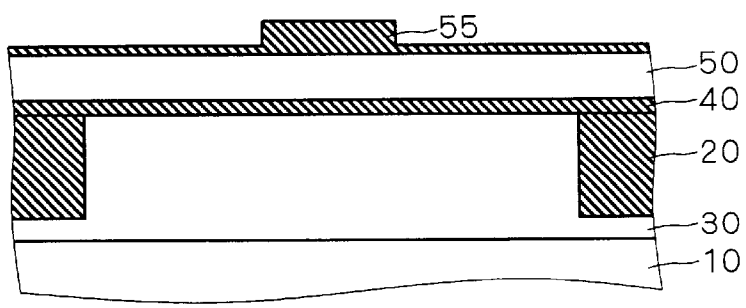

The photoresist is then removed (FIG. 2). Subsequently the anti-reflection coating 56 is removed by wet etching with an etching solution of phosphoric acid, for example, or by anisotropic etching such as RIE (FIG. 3).

If in this way the hard mask 55 is not completely etched so as to leave the non-single crystalline silicon film 50 covered, the non-single crystalline silicon film 50 will never be exposed during the removal of the anti-reflection coating 56. Thus, even when a material which is difficult to increase etch selectivity to the non-single crystalline silicon film 50 is used for the anti-reflection coating 56, a depression or a difference in level is unlikely to occur in the non-single crystalline silicon film 50, which allows the manufacture of a semiconductor device of constant finished dimensions as designed.

If a material having etch selectivity to the hard mask 55 is used for the anti-reflection coating 56, the anti-reflection coating 56 can be removed by etching while leaving the hard mask 55.

Figure 4:
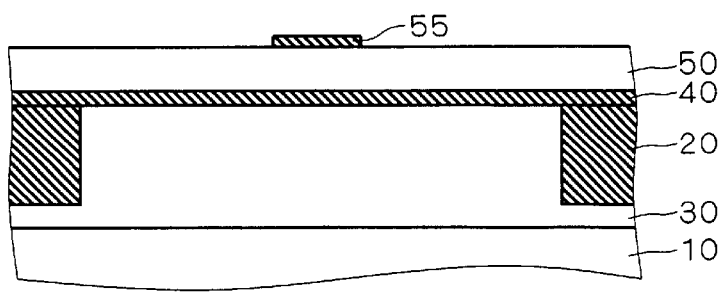

Next, the etching of the hard mask 55 which has not been completed is completed. For example, isotropic etching with an etching solution of hydrofluoric acid, for example, is employed for the etching of the hard mask 55, thereby to reduce a patterning width of the hard mask 55 (FIG. 4). Finer patterning can be achieved through the use of a material with great controllability over etching, such as a silicon oxide film, for the hard mask 55.

When the hard mask 55 is etched by anisotropic etching such as RIE, it is difficult to reduce the patterning width of the hard mask 55; however, the etching of the hard mask 55 may be completed by such a method. During the etching of the hard mask 55, the non-single crystalline silicon film 50 also is somewhat etched. This, however, can be prevented by setting a high etch selectivity between the non-single crystalline silicon film 50 and the hard mask 55.

While in the above description, the process of removing the anti-reflection coating 56 and the process of completing the etching of the hard mask 55 are performed separately, both the processes may be performed simultaneously. That is, both the materials may be simultaneously etched by controlling the etch selectivity between the hard mask 55 and the anti-reflection coating 56.

In such a case, the etching of the anti-reflection coating 56 has to be finished at the same time as or earlier than the completion of the etching of the hard mask 55. This is because, if the removal of the hard mask 55 is completed before the removal of the anti-reflection coating 56, the non-single crystalline silicon film 50 will be etched with the etching of the anti-reflection coating 56. If only this requirement is satisfied, both the processes can be performed simultaneously with the same effect as would be when they are performed separately.

Figure 5:
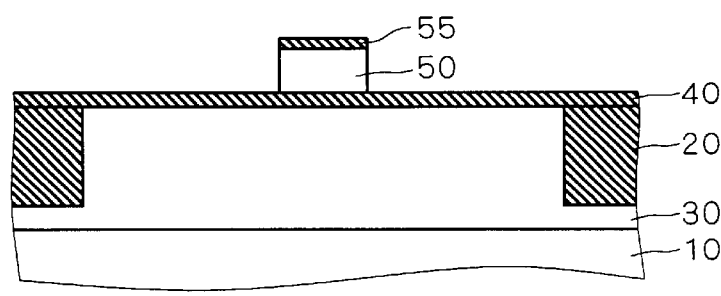

Next, the non-single crystalline silicon film 50 is etched using the hard mask 55 as a mask, whereby a gate electrode is formed (FIG. 5).

Figure 14:
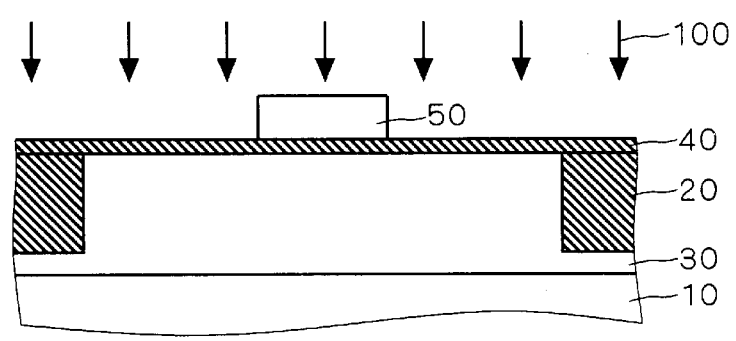

Following this, the hard mask 55 and the portion of the gate insulating film 40 which is not covered with the non-single crystalline silicon film 50 are removed. Subsequent ion implantation 100, as shown in FIG. 14, produces the source/drain extension layers 60 in the well 30. If the ionic species to be implanted has to be changed depending on the type, p-type or n-type, of the well 30, one side of the well 30 should be covered as necessary with the photoresist.

Figure 15:
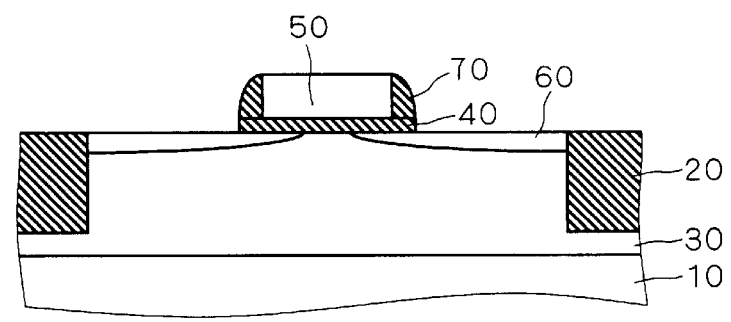

Then, as shown in FIG. 15, an insulating film to cover the gate insulating film 40 and the non-single crystalline silicon film 50 is formed and etched to form the gate sidewall protection films 70.

Figure 16:
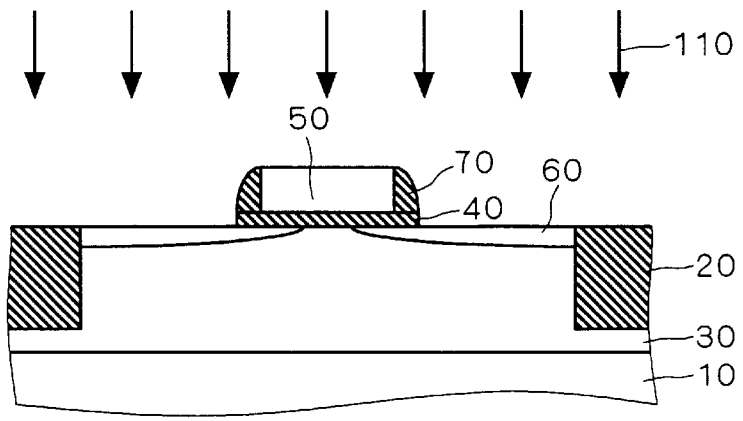

Subsequent ion implantation 110, as shown in FIG. 16, produces the source/drain regions 80 in the well 30. Here again, if the ionic species to be implanted has to be changed depending on the type, p-type or n-type, of the well 30, one side of the well 30 should be covered as necessary with the photoresist. Further, thermal processing may be performed for recovering damage from the ion implantation.

Figure 17:
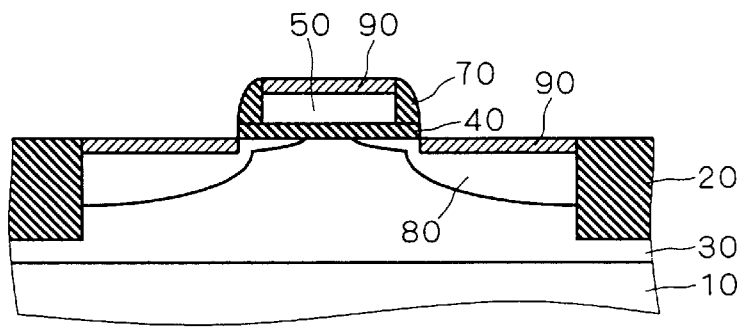
Figure 18:
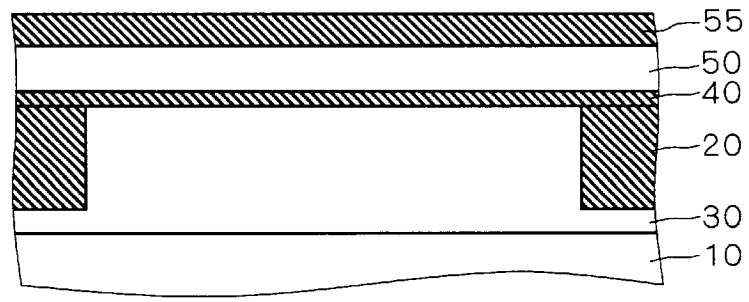
Figure 19:
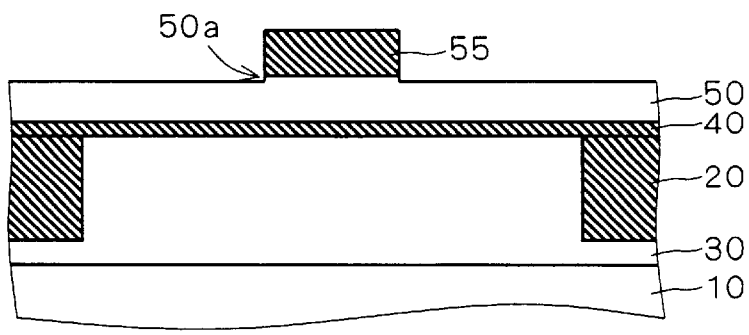
Figure 20:
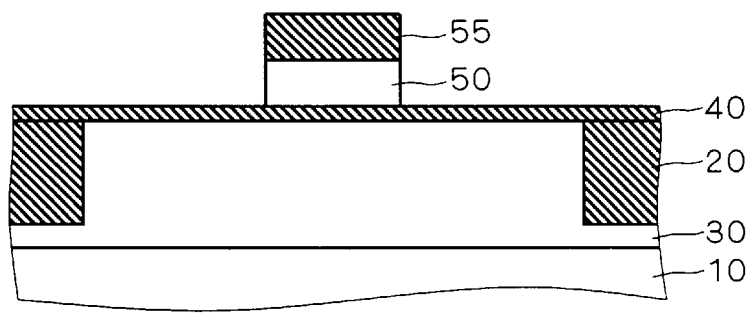
Figure 21:
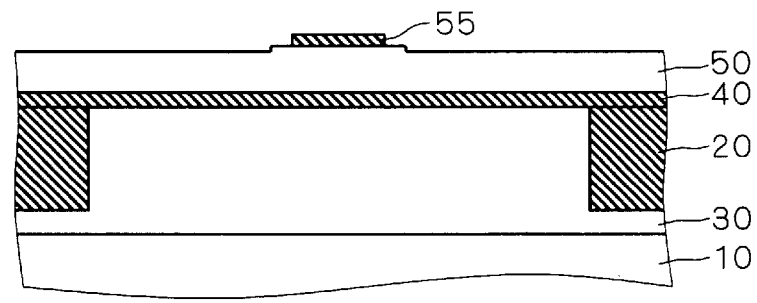
Figure 22:
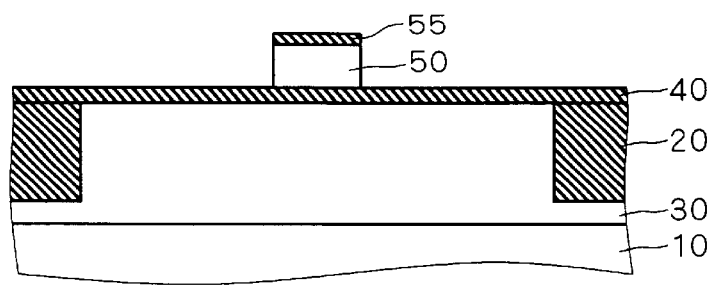

Then, as shown in FIG. 17, a metal film (e.g., Co) is formed by sputtering to cover the gate electrode and the substrate, and through thermal processing, the silicide layers 90 of CoSi$_2$, etc., are formed in the surface of the gate electrode of the non-single crystalline silicon film 50 and in the surface of the source/drain regions 80. At this time, the unreacted metal film is removed and residual compounds are changed into the silicide layers 90 through appropriate thermal processing.

While the above description refers to the method of manufacturing a gate electrode of a MOSFET, the same process as shown in FIGS. 1 to 5 is also applicable to the formation of a wiring structure on the substrate.

According to this preferred embodiment, the hard mask 55 is not completely etched before the removal of the anti-reflection coating 56 (FIG. 2) and the anti-reflection film 56 is removed by etching while leaving the hard mask 55 (FIG. 3). Thus, even when a material which is difficult to increase etch selectivity to the non-single crystalline silicon film 50 is used for the anti-reflection coating 56, a depression or a difference in level is unlikely to occur in the non-single crystalline silicon film 50, which allows the manufacture of a semiconductor device of constant finished dimensions as designed.

Further, if the etching of the hard mask 55 is completed by isotropic etching after the removal of the anti-reflection coating 56, the patterning width of the hard mask 55 can be reduced; therefore, the non-single crystalline silicon film 50 can be patterned without causing a difference in level. From this, finer patterning of the non-single crystalline silicon film 50 becomes possible.

While in this preferred embodiment, the anti-reflection coating 56 is used as a film having a low etch selectivity to the non-single crystalline silicon film 50, not only the anti-reflection film but also any other functional film which has a predetermined function and which can be formed on the hard mask 55 can achieve the same effect as described above.

<Second Preferred Embodiment>

In this preferred embodiment, after patterning of the anti-reflection coating and the hard mask, a second hard mask is formed in a portion of the non-single crystalline silicon film which is not covered with both the anti-reflection film and the hard mask, and then the anti-reflection coating is removed by etching while leaving the hard mask and the second hard mask. This achieves a semiconductor device manufacturing method that is capable of manufacturing a semiconductor device of constant finished dimensions as designed even when a material which is difficult to increase etch selectivity to the non-single crystalline silicon film is used for the anti-reflection coating.

Figure 6:
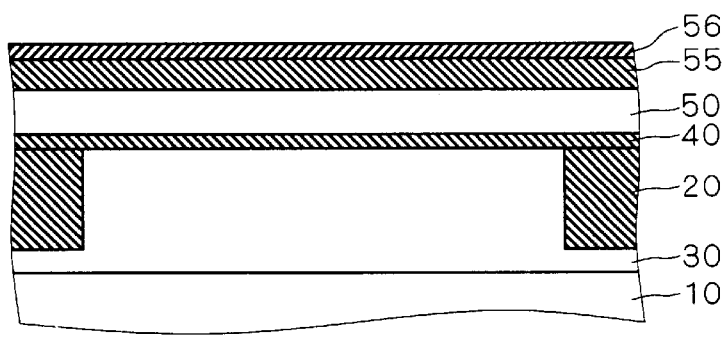
FIGS. 6 to 11 illustrate a method of manufacturing a semiconductor device according to a second preferred embodiment.

This preferred embodiment will also be described using, for example, a method of manufacturing a MOSFET. First, as in the first preferred embodiment, the gate insulating film 40, the non-single crystalline silicon film 50, the hard mask 55, and the anti-reflection coating 56 are formed in this order on the semiconductor substrate 10, such as a silicon substrate, in the surface of which the well 30 and the element isolation film 20 are formed (FIG. 6). For example, as in the first preferred embodiment, a silicon oxide film is used for the gate insulating film 40, polysilicon or amorphous silicon for the non-single crystalline silicon film 50, a silicon oxide film for the hard mask 55, and a silicon oxy-nitride film for the anti-reflection film 56. The anti-reflection coating 56 is of a material having etch selectivity to the hard mask 55 (if a silicon oxide film and a silicon oxy-nitride film are used for the hard mask 55 and the anti-reflection coating 56, respectively, etch selectivity is provided therebetween).

The gate insulating film 40, the non-single crystalline silicon film 50, the hard mask 55, and the anti-reflection coating 56 are 0.5–10 nm thick, 30–50 nm thick, 10–100 nm thick, and 10–100 nm thick, respectively.

Then, a photoresist is formed on the anti-reflection coating 56 and is patterned by the photolithographic technique for formation of a gate electrode. At this time, the presence of the anti-reflection coating 56 allows precise transfer of a gate electrode pattern on the photoresist. The hard mask 55 and the anti-reflection coating 56 are then etched using the photoresist as a mask.

Figure 7:
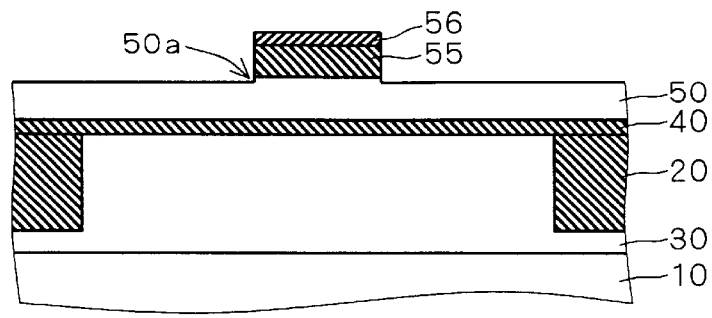
Figure 8:
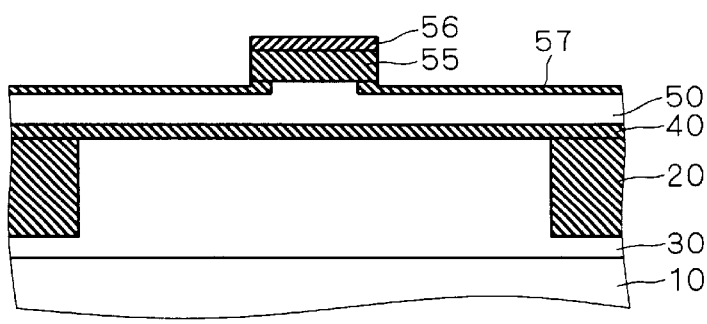

The photoresist is then removed (FIG. 7). Subsequently, a second hard mask 57 having etch selectivity to the anti-reflection coating 56 is formed in a portion of the non-single crystalline silicon film 50 which is not covered with both the anti-reflection coating 56 and the hard mask 55 (FIG. 8).

For example, a silicon oxide film is used for the second hard mask 57. The second hard mask 57 is formed for example by oxidizing the surface of the non-single crystalline silicon film 50 using a thermal oxidation technique or the like.

Figure 9:
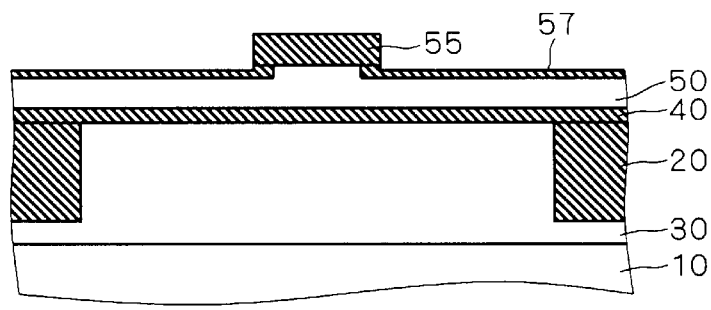

The anti-reflection coating 56 is then removed by wet etching with an etching solution of phosphoric acid, for example, or by anisotropic etching such as RIE (FIG. 9).

The formation of the second hard mask 57 prevents the non-single crystalline silicon film 50 from being exposed during the removal of the anti-reflection coating 56. Thus, even when a material which is difficult to increase etch selectivity to the non-single crystalline silicon film 50 is used for the anti-reflection coating 56, a depression or a difference in level is unlikely to occur in the non-single crystalline silicon film 50, which allows the manufacture of a semiconductor device of constant finished dimensions as designed.

If a material having etch selectivity to the hard mask 55 and the second hard mask 57 is used for the anti-reflection coating 56, the anti-reflection coating 56 can be removed by etching while leaving the hard mask 55 and the second hard mask 57.

Figure 10:
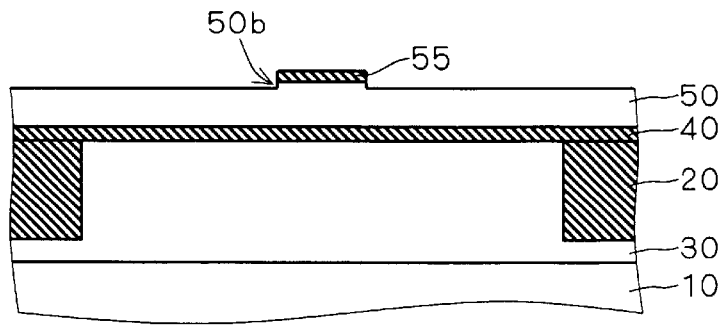

Next, the second hard mask 57 is removed by etching. For example, isotropic etching with an etching solution of hydrofluoric acid, for example, is employed for the etching of the second hard mask 57. At the same time as the removal of the second hard mask 57, the patterning width of the hard mask 55 is reduced (FIG. 10).

Figure 26:
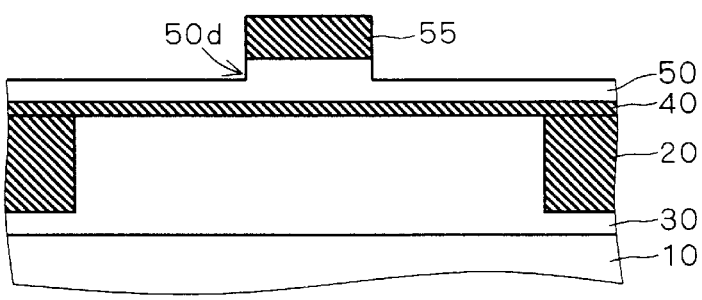
Figure 27:
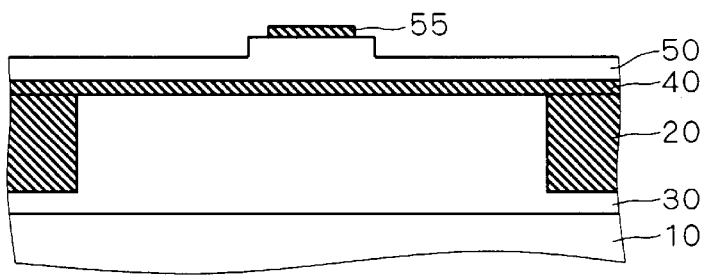
Figure 28:
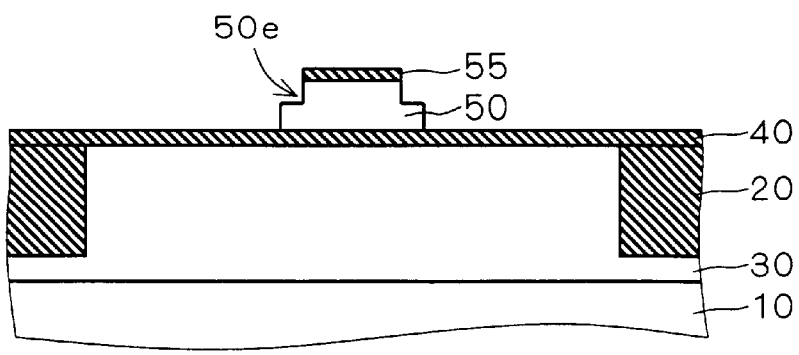
Figure 29:
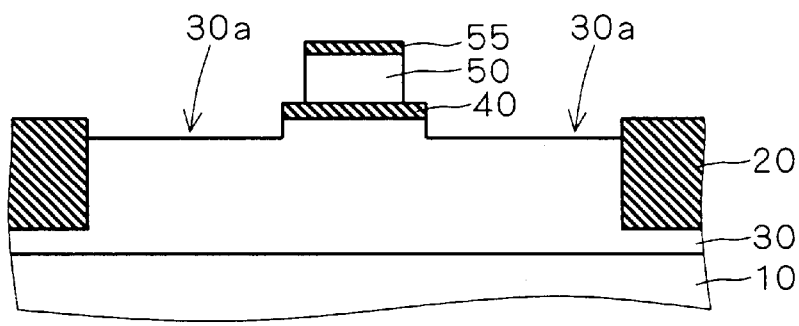

Since the second hard mask 57 is also formed on the side surfaces of a gate electrode portion of the non-single crystalline silicon film 50, the non-single crystalline silicon film 50 has a slight difference in level 50*b*. However, the difference in level 50*b* is not as great as the difference in level 50*d* shown in FIG. 26 and thus it is negligible.

Further, the formation of the second hard mask 57 by oxidation, such as thermal oxidation, facilitates the formation of the second hard mask 57 and improves controllability over film thickness. By previously and precisely controlling the thickness of the second hard mask 57 which has been formed to extend to a point under the hard mask 55, the patterning width of the gate electrode can also be determined as designed.

If a material with great controllability over etching, such as a silicon oxide film, is used for the hard mask 55, the patterning width of the gate electrode as designed can be patterned on the hard mask 55.

During the etching of the hard mask 55 and the second hard mask 57, the non-single crystalline silicon film 50 also is somewhat etched. This, however, can be prevented by setting a high etch selectivity between the non-single crystalline silicon film 50 and both the hard mask 55 and the second hard mask 57.

While in the above description, the process of removing the anti-reflection coating 56 and the process of removing the second hard mask 57 and reducing the hard mask 55 are performed separately, both the processes may be performed simultaneously. That is, both the materials may be simultaneously etched by controlling the etch selectivity between the anti-reflection coating 56 and both the hard mask 55 and the second hard mask 57.

In such a case, the etching of the anti-reflection coating 56 has to be finished at the same time as or earlier than the completion of the removal of the second hard mask 57. This is because, if the removal of the second hard mask 57 is completed before the removal of the anti-reflection coating 56, the non-single crystalline silicon film 50 is etched with the etching of the anti-reflection coating 56. If only this requirement is satisfied, both the processes can be processed simultaneously with the same effect as would be when they are performed separately.

Figure 11:
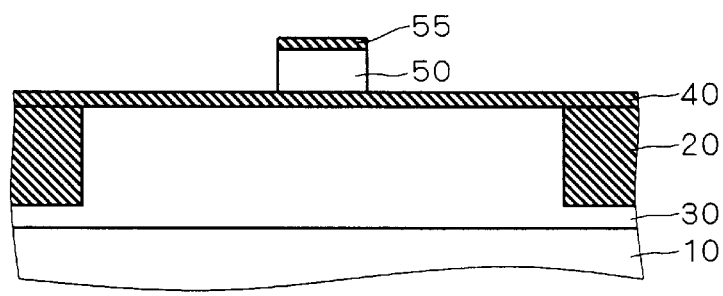
Figure 12:
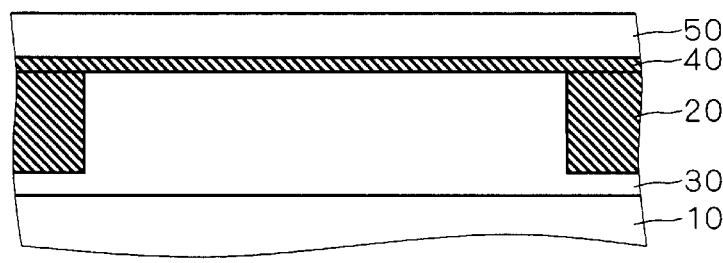
FIGS. 12 to 22 illustrate a conventional method of manufacturing a semiconductor device.
Figure 13:
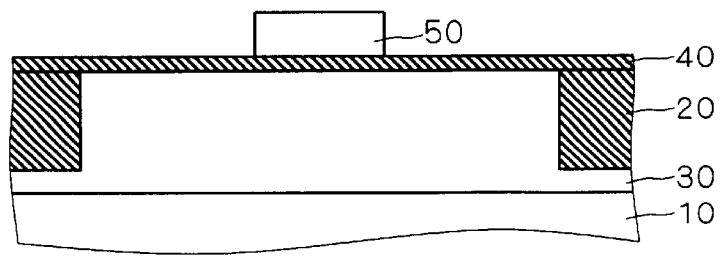

Next, the non-single crystalline silicon film 50 is etched using the hard mask 55 as a mask, whereby a gate electrode is formed (FIG. 11).

Hereinafter, a MOSFET is manufactured in the same manner as in the first preferred embodiment.

While the above description refers to the method of manufacturing a gate electrode of a MOSFET, the same process as shown in FIGS. 6 to 11 is also applicable to the formation of a wiring structure on the substrate.

According to this preferred embodiment, the second hard mask 57 having etch selectivity to the anti-reflection coating 56 is formed in a portion of the non-single crystalline silicon film 50 which is not covered with both the anti-reflection coating 56 and the hard mask 55, and then the anti-reflection coating 56 is removed by etching while leaving the hard mask 55 and the second hard mask 57. Thus, even when a material which is difficult to increase etch selectivity to the non-single crystalline silicon film 50 is used for the anti-reflection coating, a depression or a difference in level is unlikely to occur in the non-single crystalline silicon film 50, which allows the manufacture of a semiconductor device of constant finished dimensions as designed.

Further, since the removal of the second hard mask 57 is made by isotropic etching which reduces the patterning width of the hard mask 55, the non-single crystalline silicon film 50 can be patterned without causing a difference in level. From this, finer patterning of the non-single crystalline silicon film 50 becomes possible.

The second hard mask 57 is formed by oxidizing the surface of the non-single crystalline silicon film 50. This facilitates the formation of the second hard mask 57 and improves controllability over film thickness.

While in this preferred embodiment, the anti-reflection coating 56 is used as a film having a low etch selectivity to the non-single crystalline silicon film 50, not only the anti-reflection film but also any other functional film which has a predetermined function and which can be formed on the hard mask 55 can achieve the same effect as described above.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) forming a film to be etched, an etching mask, and an anti-reflection coating in this order on a substrate;
   (b) patterning said anti-reflection coating and said etching mask by photolithographic and etching techniques, wherein etching of said etching mask is stopped halfway through the patterning;
   (c) removing said anti-reflection coating by etching after said etching is stopped;
   (d) completing said etching of said etching mask which has been stopped in said step (b); and
   (e) patterning said film to be etched using said etching mask as a mask.

2. The method of manufacturing a semiconductor device according to claim 1, wherein
   in said step (d), isotropic etching is performed to reduce a patterning width of said etching mask.

3. The method of manufacturing a semiconductor device according to claim 1, wherein
   said anti-reflection coating has etch selectivity to said etching mask, and
   said step (c) is performed prior to said step (d).

4. The method of manufacturing a semiconductor device according to claim 1, wherein
   said etching of said anti-reflection coating in said step (c) is completed at the same time as or earlier than completion of said etching of said etching mask in said step (d).

5. The method of manufacturing a semiconductor device according to claim 1, wherein
   said anti-reflection coating is a silicon oxy-nitride film.

6. The method of manufacturing a semiconductor device according to claim 1, wherein
   said etching mask is a silicon oxide film.

7. The method of manufacturing a semiconductor device according to claim 1, wherein
   said film to be etched is a non-single crystalline silicon film,
   in said step (a), a gate insulating film is further formed between said substrate and said non-single crystalline silicon film,
   said method further comprising the step of:
   (f) forming a source/drain region by ion implantation in said substrate.

8. The method of manufacturing a semiconductor device according to claim 7, further comprising the steps of:
   (g) after the patterning of said step (e), said etching mask and a portion of said gate insulating film which is not covered with said non-single crystalline silicon film are removed by an etching technique; and
   (h) forming a silicide layer in said source/drain region and in said non-single crystalline silicon film.

9. A method of manufacturing a semiconductor device, comprising the steps of:
   (a) forming a film to be etched, a first etching mask, and an anti-reflection coating in this order on a substrate;
   (b) patterning said anti-reflection coating and said first etching mask by photolithographic and etching techniques;
   (c) forming a second etching mask in a portion of said film to be etched which is not covered with both said anti-reflection coating and said first etching mask;

(d) removing said anti-reflection coating by etching;

(e) removing said second etching mask by etching; and (f) patterning said film to be etched using said first etching mask as a mask.

10. The method of manufacturing a semiconductor device according to claim 9, wherein in said step (e), the removal of said second etching mask is made by isotropic etching which reduces a patterning width of said first etching mask.

11. The method of manufacturing a semiconductor device according to claim 9, wherein said film to be etched is a non-single crystalline silicon film, said second etching mask is a silicon oxide film, and in said step (c), said second etching mask is formed by oxidizing a surface of said non-single crystalline silicon film.

12. The method of manufacturing a semiconductor device according to claim 9, wherein said anti-reflection coating has etch selectivity to said second etching mask, and said step (d) is performed prior to said step (e).

13. The method of manufacturing a semiconductor device according to claim 9, wherein the removal of said anti-reflection coating in said step (d) is completed at the same time as or earlier than the removal of said second etching mask in said step (e).

14. The method of manufacturing a semiconductor device according to claim 9, wherein said anti-reflection coating is a silicon oxy-nitride film.

15. The method of manufacturing a semiconductor device according to claim 9, wherein said first etching mask is a silicon oxide film.

16. The method of manufacturing a semiconductor device according to claim 9, wherein said film to be etched is a non-single crystalline silicon film, and in said step (a), a gate insulating film is further formed between said substrate and said non-single crystalline silicon film, said method further comprising the step of:

(g) forming a source/drain region by ion implantation in said substrate.

17. The method of manufacturing a semiconductor device according to claim 16, further comprising the steps of:

(h) after the patterning of said step (f), removing said first etching mask and a portion of said gate insulating film which is not covered with said non-single crystalline silicon film by an etching technique; and (i) forming a silicide layer in said source/drain region and in said non-single crystalline silicon film.

\* \* \* \* \*